(12) United States Patent
Thazhathidathil

(10) Patent No.: US 11,288,433 B2
(45) Date of Patent: Mar. 29, 2022

(54) POWER GRID LAYOUT TECHNIQUES

(71) Applicant: Arm Limited, Cambridge (GB)

(72) Inventor: Abhilash Velluridathil Thazhathidathil, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/595,180

(22) Filed: Oct. 7, 2019

(65) Prior Publication Data
US 2021/0103640 A1 Apr. 8, 2021

(51) Int. Cl.
*G06F 30/33* (2020.01)
*G06F 30/392* (2020.01)
*G06F 30/394* (2020.01)

(52) U.S. Cl.
CPC .......... *G06F 30/392* (2020.01); *G06F 30/394* (2020.01)

(58) Field of Classification Search
CPC ............. H01L 27/0207; H01L 29/7853; H01L 23/5226; H01L 2027/11874; H01L 23/528; H01L 21/76858; H01L 23/53223; H01L 27/0924; H01L 23/5286; H01L 21/7685; H01L 27/0826; H01L 2924/13091; G06F 30/392; G06F 2119/18; G06F 30/39; G06F 30/394; G06F 30/398; G06F 30/30; G06F 2115/08; G06F 30/3323; G06F 15/76; G03F 1/36
USPC .................................. 716/118–125
See application file for complete search history.

(56) References Cited

U.S. PATENT DOCUMENTS

| | | | |
|---|---|---|---|
| 2013/0069236 A1* | 3/2013 | Chen | H01L 27/0207 257/758 |
| 2015/0371959 A1* | 12/2015 | Frederick, Jr | G06F 30/394 361/748 |
| 2018/0144082 A1* | 5/2018 | Hanchinal | G06F 30/392 |
| 2018/0315709 A1* | 11/2018 | Schultz | H01L 29/78696 |
| 2019/0303527 A1* | 10/2019 | Tien | G06F 30/394 |

* cited by examiner

*Primary Examiner* — Binh C Tat
(74) *Attorney, Agent, or Firm* — Pramudji Law Group PLLC; Ari Pramudji

(57) ABSTRACT

Various implementations described herein refer to a method for providing a cell layout with a power grid line, track lines and vias. The method may include determining a cell placement pitch from architecture rules related to the cell layout. The method may include converting spacing for the vias in terms of the cell placement pitch to identify free regions on the track lines for placement of the vias. The method may include determining boundaries for the free regions based on the spacing of the vias from the power grid line and the track lines.

18 Claims, 6 Drawing Sheets

POWER GRID LAYOUT TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Via position in standard cells may play a role in power grid planning, e.g., when the cell vias are close to a power rail. Standard cell architecture may be designed to allow insertion of vias along with additional power rails during the power planning stage of place and route. The power planning may occur before the standard cell placement (pre-route) or after the standard cell placement (post-route). In some instances, pre-route may be preferred over post-route due to EMIR (electro-magnetic current-resistance) predictability. Some high-density (HD) architectures have cell vias that may block power grid vias, and thus, HD architectures may have to opt for post-route via insertion to legalize placement of the vias. An alternative option may refer to restricting cell level vias, which may impact area and design density. Thus, there exists a need to improve physical layout design implementation of vias while generating physical cell layouts, e.g., by improving power via insertion in many different types of power grid architectures.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein relate to power grid layout schemes and techniques that improve power grid (PG) layout in cell architectures. For instance, the various schemes and techniques described herein may provide for a system or device that uses via spacing methodologies to pre-route power rail via insertion. Accordingly, the various schemes and techniques described herein may provide for methodologies that resolve pre-route via spacing violations so as to improve power grid (PG) layout designs for the structure of various different cell architectures.

In some implementations, an important factor in standard cell placement may refer to a horizontal placement pitch (x-axis) on a power grid, wherein cell width may refer to any multiple of the horizontal placement pitch (or x-pitch along the x-axis). Location of any object may be considered predictable during place and route (PnR), if the object is bound to a grid (e.g., x-pitch). The methodologies described herein provide for the power rail via pitch to be converted as a multiple of the x-pitch (e.g., via pitch=2*x-pitch), when the x-pitch is greater than a legal spacing rule between vias. For instance, the via pitch may be converted in terms of x-pitch. For "x", if the via pitch is greater than the x-pitch, then the converted pitch may start with 2*x-pitch. If the via pitch is smaller than the x-pitch, then the converted pitch may be started at 1*x-pitch itself. Generally, there may be no restrictions in the x-pitch and in converting the x-pitch.

Based on a new via position and the via spacing rule, a landing zone may be defined for tracks that are subject to blockage. In some instances, the landing zones in a cell structure may repeat on a pitch that is similar to the power rail via pitch based on the methodologies described herein. For instance, if a landing zone (or free access region) starts at an even pitch location (2*x-pitch), then the next landing zone (or next free access region) may be at a 4*x-pitch location, then next at a 6*x-pitch location, and so on. Also, the PnR methodologies described herein may provide for evaluation of an EMIR (electro-magnetic current-resistance) penalty when compared to an optimal via spacing proportion of y=2*x/y. Some via spacing rules may be coded in a PnR techfile, and once via spacing methodologies are applied, the standard cell architecture may be placed on legal positions in a physical cell layout design with pre-routed power grids.

Various implementations of power grid layout schemes and techniques will be described in detail herein below with reference to FIGS. 1-4.

Figure 1:
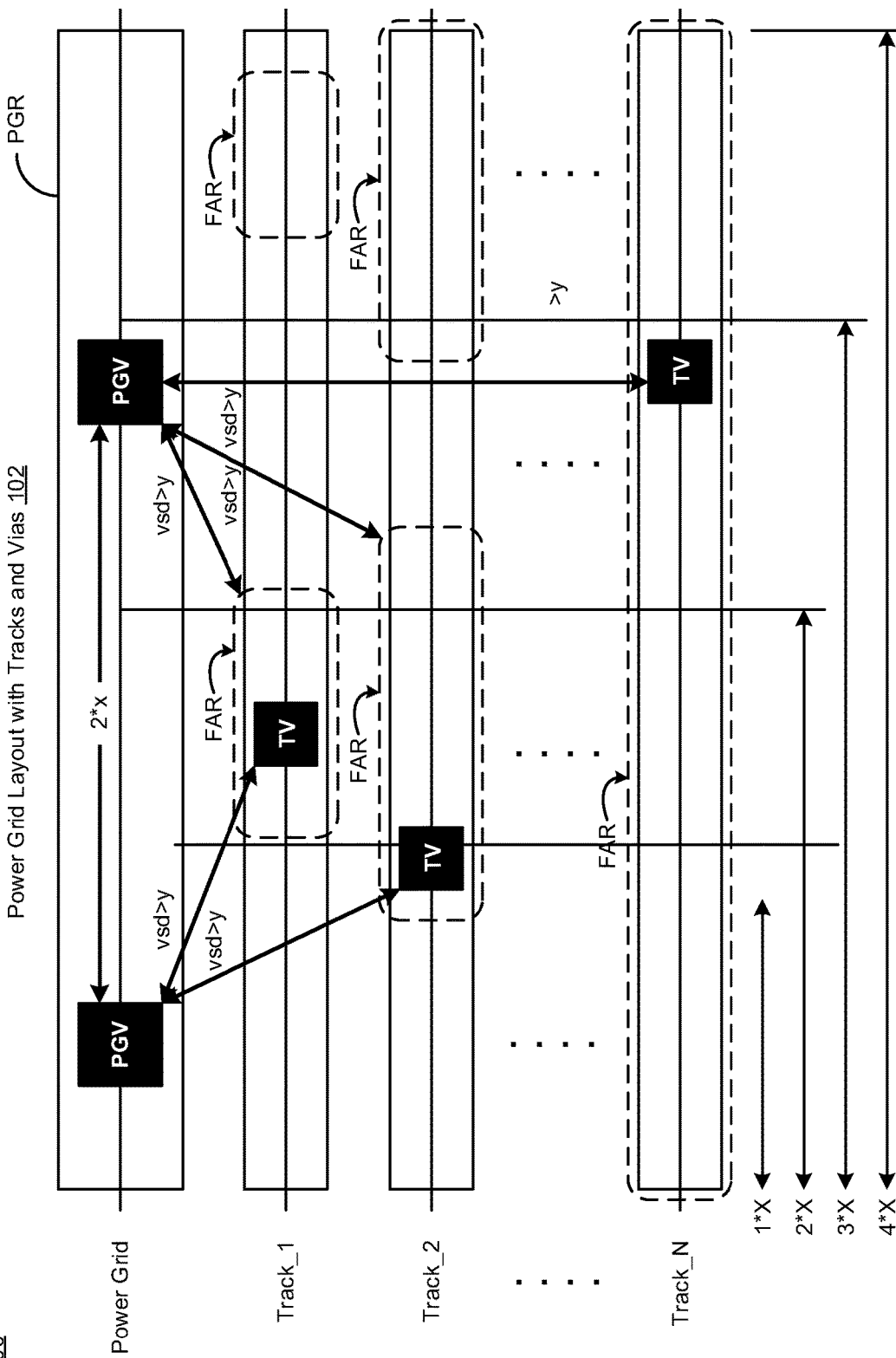
FIG. 1 illustrates a diagram of power grid circuitry in accordance with various implementations described herein.

FIG. 1 illustrates a diagram of power grid circuitry 100 in accordance with various implementations described herein. In various instances, the power grid circuitry 100 may refer to a device having power grid architecture with a power grid, multiple tracks and multiple vias fabricated with various physical cell layout schemes and techniques as described herein. Also, the power grid architecture may be fabricated with the via spacing schemes and techniques described herein for physical cell layout.

As shown in reference to FIG. 1, the power grid circuitry 100 may include a structure comprising a cell layout having a power grid line (or rail, PGR), one or more track lines (e.g., track_1, track_2, . . . , track_N) and one or more vias (V, PGV, TV). In some instances, the power grid circuitry 100 may be configured to provide a power supply (e.g., Vdd, Vss) to various components via the power rail (PGR). The cell layout may include metal layers, such as, e.g., a first metal layer (M1), a second metal layer (M2), and a third metal layer (M3). As such, the power grid rail (PGR) may provide a power supply (Vdd) or a ground supply (Vss or Gnd) by way of a metal layer. The structure of cell layout may include at least one power grid line (or rail, PGR) and any number (N) of tracks or track lines (e.g., track_1, track_2, . . . , track_N) that may be formed with a metal layer, such as, e.g., the metal 2 layer (M2). The structure of cell layout may include any number (N) of vias (V, PGV, TV), and the vias (V, PGV, TV) may refer to vertical interconnect access lines associated with the at least one power grid line (or rail, PGR) and the one or more tracks or track lines (e.g., track_1, track_2, . . . , track_N). In some instances, the vertical interconnect access lines may be disposed on a z-axis when the x-pitch and y-pitch refer to the x-axis and y-axis, respectively, as grid coordinates.

The power grid circuitry 100 may include one or more free landing zones or free access regions (FAR) that may be defined on the track lines (e.g., track_1, track_2, . . . , track_N) for placement of the vias (V). In some instances, spacing for vias (V) may be converted in terms of a cell placement pitch (e.g., x-pitch) so as to identify the free access regions (FAR) on the track lines (e.g., track_1, track_2, . . . , track_N) for placement of the vias (V). The cell placement pitch (e.g., x-pitch) may be determined from architecture rules related to the cell layout, and the free access regions (FAR) have boundaries that are determined based on the spacing of the vias (V) from the power grid line (or rail, PGR) and the track lines (e.g., track_1, track_2, . . . , track_N). Also, the vias (V) may be spaced apart by a spacing distance (sd), which may be greater than a y-pitch (sd<y). In some instances, y or y-pitch may refer to a minimum via spacing between vias (V), and as such, via spacing may refer to the spacing distance (sd) between the vias (V), wherein the via spacing distance (vsd) is greater that the y-pitch (i.e., sd=vsd, and vsd>y).

In some instances, along with the cell placement pitch (e.g., x-pitch), a cell height (e.g., y-pitch) may be determined from the architecture rules related to the cell layout. Thus, in this instance, the cell placement pitch (e.g., x-pitch) may refer to a linear horizontal distance across a cell boundary (associated with an x-axis as a grid coordinate), and the cell height (y-pitch) may refer to a linear vertical distance across the cell boundary (associated with a y-axis as another grid coordinate).

In various implementations, the vias (V) may include power grid vias (PGV) for placement on the power grid line (or rail, PGR), and the vias (V) may include track vias (TV) for placement on the track lines (e.g., track_1, track_2, . . . , track_N). As shown in FIG. 1, the power grid vias (PGV) may be spaced apart by a distance (e.g., 2*X) that is greater than or equal to a cell width (e.g., x-pitch), and in some instances, the cell width (e.g., x-pitch) may refer to a number of cell placement pitches, such as, e.g., the via pitch may be 1*X, 2*X, 3*X, 4*X, etc. Also, the free regions (FAR) may refer to via placement zones for landing the track vias (TV) on the tracks or track lines (e.g., track_1, track_2, . . . , track_N) within a boundary of the via placement zones. In some instances, as shown in FIG. 1, the track vias (TV) may be disposed within the boundary of the via placement zones based on the spacing of the vias (V) from the power grid line (or rail, PGR) and the track lines (e.g., track_1, track_2, . . . , track_N). Also, the boundary of the via placement zones may be defined by a linear distance from the power grid vias (PGV).

In some implementations, as shown in FIG. 1, the cell placement pitch refers to x-pitch (e.g., 1*X), and the cell width may refer to multiples of the cell placement pitch (e.g., 2*X, 3*X, 4*X, etc.). Thus, the cell width may be a larger number value (e.g., multiple of x-pitch) than the cell placement pitch (e.g., x-pitch), e.g., wherein the cell width may be greater than or equal to 1*x-pitch. After converting via spacing in terms of the x-pitch, the via spacing should meet design rules in reference to design rule checking (DRC). For instance, a foundry may provide design rules for DRC, which is technology specific, and the physical layout design should pass DRC. The various power grid layout schemes and techniques described herein seek to improve the power grid layout in a cell structure by converting via spacing in terms of the cell placement pitch (x-pitch). Also, the cell width may be configured as a function of the cell placement pitch (x-pitch).

Generally, design rules refer to a set of parameters provided by semiconductor manufacturers that enable a chip designer to verify accuracy of a mask set. Design rules are typically specific to a particular semiconductor manufacturing process, and a design rule set may specify particular geometric and connectivity restrictions so as to ensure sufficient margins that may account for variability in various semiconductor manufacturing processes to ensure that the circuitry works appropriately. Design rule checking (DRC) may be used to achieve a higher overall yield and reliability for a design. For instance, if design rules are violated, the design may not be functional. Also, to achieve a production goal of improving die yields, DRC typically involves design rules that modify and/or change existing features, insert new features and/or check an entire design for process limitations, such as, e.g., layer density. In some instances, a cell layout may include the geometric representation of the design and also data that provides support for manufacture of the cell layout design. While design rule checks may not validate that the design will operate correctly, the design rule checks may be constructed to verify that the structure meets the process constraints for a given design type and process technology.

Figure 2:
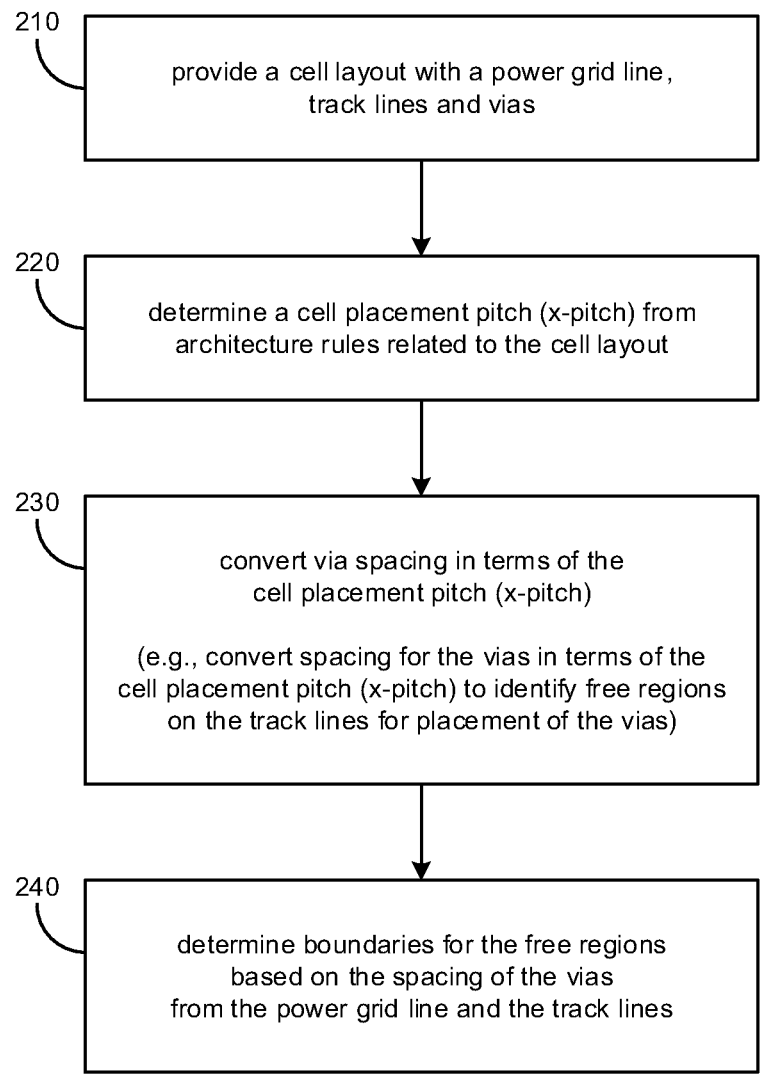
FIG. 2 illustrates a process flow diagram of a method for power grid layout in accordance with various implementations described herein.

FIG. 2 illustrates a process flow diagram of a method 200 for power grid layout in accordance with various implementations described herein. In some implementations, method 200 may refer to various physical cell layout schemes and techniques for power grid architecture having a power grid, multiple tracks and multiple vias. Also, method 200 may refer to a via spacing scheme and technique for the physical cell layout.

At block 210, method 200 may provide a cell layout with a power grid line, track lines and vias. In various implementations, the power grid line may include one or more power grid lines, the track lines may include one or more track lines, and the vias may include any number of vertical interconnect access lines associated with the one or more power grid lines and the one or more track lines.

At block 220, method 200 may determine a cell placement pitch (i.e., x-pitch) from architecture rules related to the cell layout. In some implementations, method 200 may also determine a cell height (i.e., y-pitch) from the architecture rules related to the cell layout. The cell placement pitch (i.e., x-pitch) may refer to a linear horizontal distance across a cell boundary, and also the cell height (i.e., y-pitch) may refer to a linear vertical distance across the cell boundary. As such, in reference to the physical cell layout of the power grid architecture, the cell layout may be arranged in a grid pattern with the x-pitch along the horizontal dimension and the y-pitch along the vertical dimension. I.e., the cell placement pitch refers to the x-pitch, and the cell height refers to the y-pitch.

At block 230, method 200 may convert (or modify, or transform) via spacing in terms of the cell placement pitch (i.e., x-pitch). In some implementations, converting the via spacing may refer to transforming spacing for the vias in terms of the cell placement pitch (i.e., x-pitch) so as to identify (or determine) one or more free access regions on the tracks or track lines for placement of the vias. In some instances, the vias may include power grid vias (PGV) for placement on the power grid line, and/or the vias may include track vias (TV) for placement on the track lines. The power grid vias may be spaced apart by a via spacing distance that is greater than or equal to the cell width (e.g., x-pitch), and in some instances, the cell width (e.g., x-pitch) may refer to a number of cell placement pitches, such as, e.g., 1*X, 2*X, 3*X, 4*X, etc., as shown in FIG. 1.

At block 240, method 200 may determine boundaries for the free regions based on the spacing of the vias from the power grid line and the track lines. In some instances, the free regions may refer to via placement zones for landing the track vias on the track lines within a boundary of the via placement zones. In some implementations, method 200 may include disposing the track vias in the via placement zones defined on the track lines, and method 200 may also include verifying that the track vias are disposed within the boundary of the via placement zones based on the spacing of the vias from the power grid line and the track lines. In this instance, the boundary of the via placement zones may be defined by a linear distance from the power grid vias.

Figure 3A:
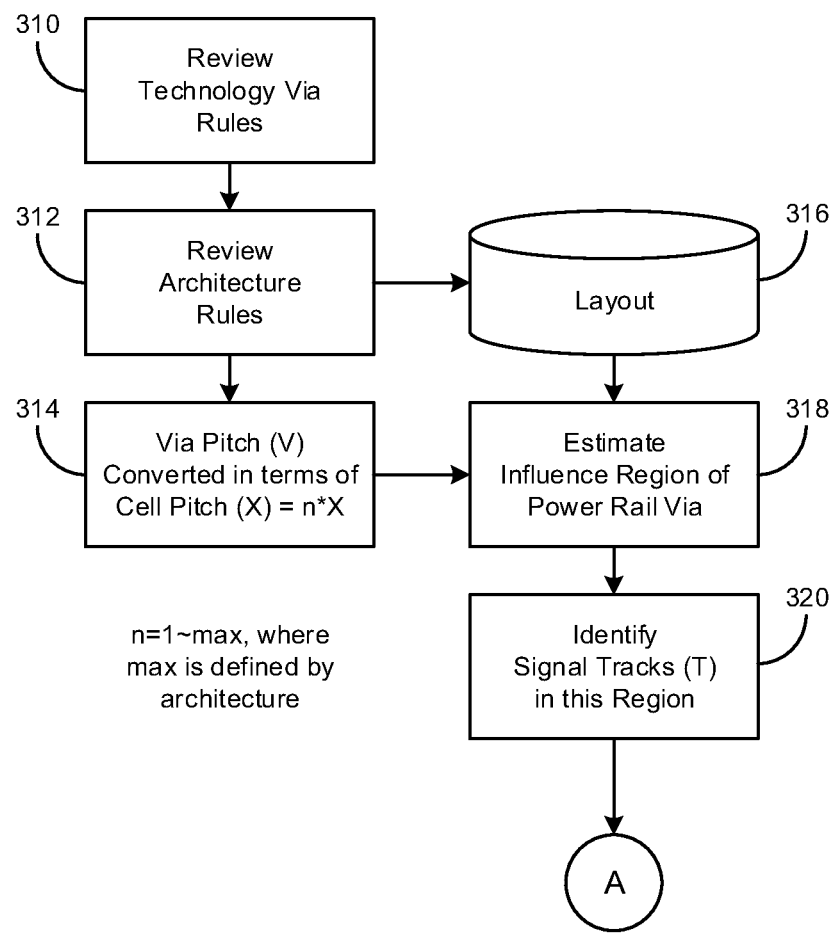
FIGS. 3A-3C illustrate process diagrams of another method for power grid layout in accordance with various implementations described herein.
Figure 3B:
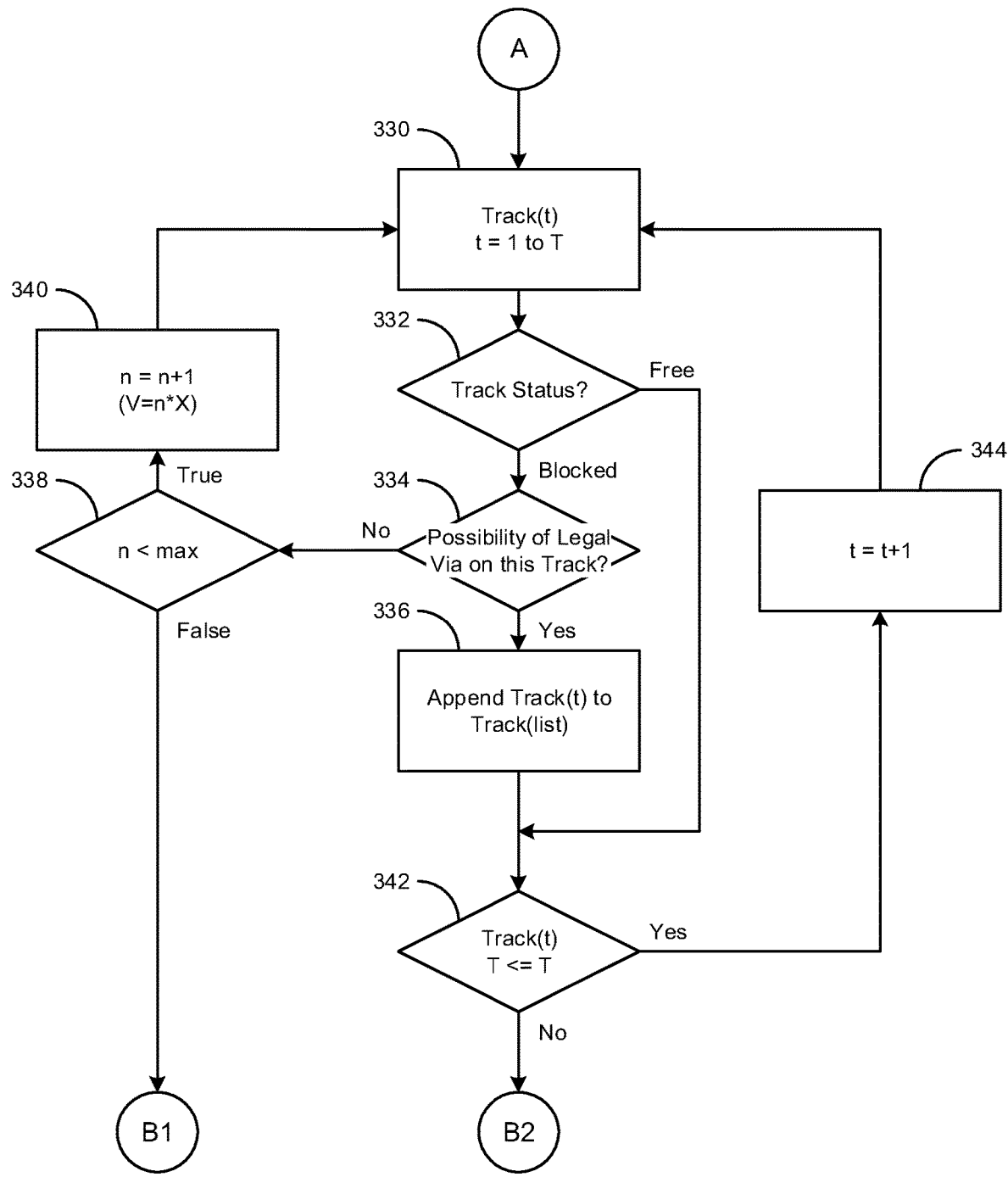
Figure 3C:
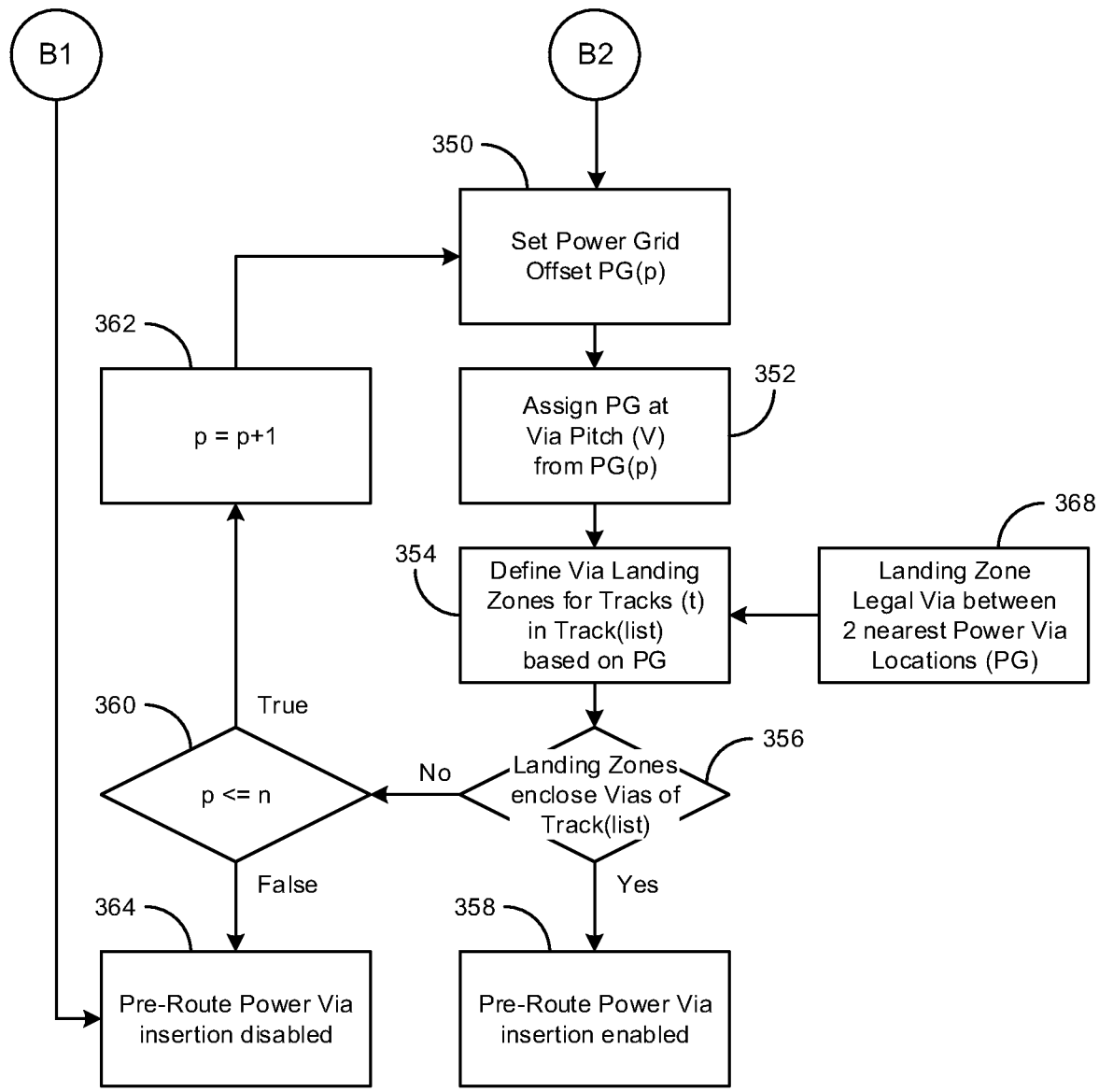

FIGS. 3A-3C illustrate a process flow diagram of a method 300 for power grid layout design in accordance with various implementations described herein. In various implementations, method 300 may refer to power grid layout schemes and techniques for resolving pre-route via spacing violations and also enabling/disabling pre-route power via insertion as described herein. As shown in FIGS. 3A-3C, method 300 may be separated into parts 302A, 302B, 302C for resolving pre-route via spacing violations.

As shown in FIG. 3A, at block 310, method 300 may review, analyze and/or apply technology via rules associated with a structure of the cell layout, and also, at block 312, method 300 may review, analyze and/or apply architecture rules associated with the structure of the cell layout. In block 316, method 300 may store the cell layout architecture in a database based on the technology via rules and the architecture rules, wherein the cell layout architecture may include information providing the cell layout with a power grid line, one or more track lines, and one or more vias.

In block 314, method 300 may determine a cell placement pitch (e.g., x-pitch) from the technology via rules and/or the architecture rules related to the structure of the cell layout architecture. Also, in block 314, method may convert spacing for the vias (i.e., via spacing having a distance) in terms of the cell placement pitch (i.e., x-pitch) to identify free regions (free access regions) on the track lines (t) for placement of the vias. In some instances, the via pitch (V) may be converted in terms of cell placement pitch (X), which refers to a function of cell width in that X=n*X. In this instance, n=1~maximum, where the maximum (or max) is defined by the cell layout architecture.

In block 318, method 300 may estimate one or more influence regions related to one or more power rail vias. Also, in block 320, method 300 may identify signal tracks (T) in the one or more influence regions. As shown, from block 320, method 300 proceeds to block 330 in FIG. 3B by way of connecting element A (i.e., encircled A).

As shown in FIG. 3B, at block 330, method 300 may set track(t) equal to one thru signal track (T), wherein t=1 to T. In decision block 332, method 300 may determine the track status, wherein if the track status is free (or available, or unblocked), then method 300 proceeds to decision block 342, and if the track status is blocked (or unavailable, or obstructed), then method 300 may proceed to decision block 334. In decision block 334, method 300 may determine whether there is a possibility of placing (or disposing) a legal via on the currently selected track. If no, then method 300 may proceed to decision block 338, and if yes, then method 300 may proceed to block 336.

In block 336, method 300 may append the track(t) to the track(list). In decision block 338, method 300 may determine whether n<max, wherein if true, then method 300 proceeds to block 340, and if false, then method 300 proceeds to block 364 in FIG. 3C by way of connecting element B1 (i.e., encircled B1). Also, in block 340, method 300 may increase n by 1, wherein n=n+1, and wherein V=n*X. From block 340, method 300 may return to block 330 to process the next track(t).

In decision block 342, method 300 may determine whether the signal track (T) is less than or equal to the signal track (T), wherein T<=T. If yes, then method 300 may proceed to block 344, and if no, then method 300 may proceed to block 350 in FIG. 3C by way of connecting element B2 (i.e., encircled B2). Also, in block 344, method 300 may increase track(t) by 1, wherein t=t+1. From block 344, method 300 may return to block 330 to process the next track(t), wherein t=t+1.

As shown in FIG. 3C, from connecting element B1, at block 364, method 300 may disable the pre-routing of power via insertion. Otherwise, from connecting element B2, at block 350, method 300 may set the power grid offset (PG(p)). For instance, the via pitch (V) may be transformed in terms of x-pitch, and thus, the via pitch (V) may be 2*x, when n=2, since V=n*x. In some instances, the PG offset (PG(p)) may have an offset of p=1 to n, and when p=2, PG(p) may have 2 offsets with p=1 and p=2, wherein the via pitch (V)=2*x for both offsets. In block 352, method 300 may assign the power grid (PG) at one or more or all via pitches (V) from the power grid offset (PG(p)). In block 354, method 300 may define via landing zones for tracks(t) in the track(list) based on the power grid (PG). Also, in block 354, method 300 may receive information related to via landing zones for legal vias between two nearest power via locations from block 368. In decision block 356, method 300 may determine whether the via landing zones enclose vias in the track(list), wherein if yes, then method 300 may proceed to block 358, and if no, then method 300 may proceed to decision block 360. In block 358, method 358 may enable the pre-routing of power via insertion.

Otherwise, in decision block 360, method 300 may determine whether p is less than or equal to n (i.e., p<=n), wherein if true, method 300 may proceed to block 362, and if false, then method 300 may proceed to block 362. In block 362, method 300 may increase p by one, wherein p=p+1. From block 362, method 300 may return to block 350 to process the next power grid offset (PG(p)), wherein p=p+1.

Accordingly, in various implementations, method 300 may provide for various power grid layout schemes and techniques for resolving pre-route via spacing violations and also enabling and/or disabling pre-route power via insertion as described herein. For instance, as described in FIG. 3C, in reference to block 358, method 358 may enable the pre-routing of power via insertion. Otherwise, in reference to block 364, method 300 may disable the pre-routing of power via insertion.

Figure 4:
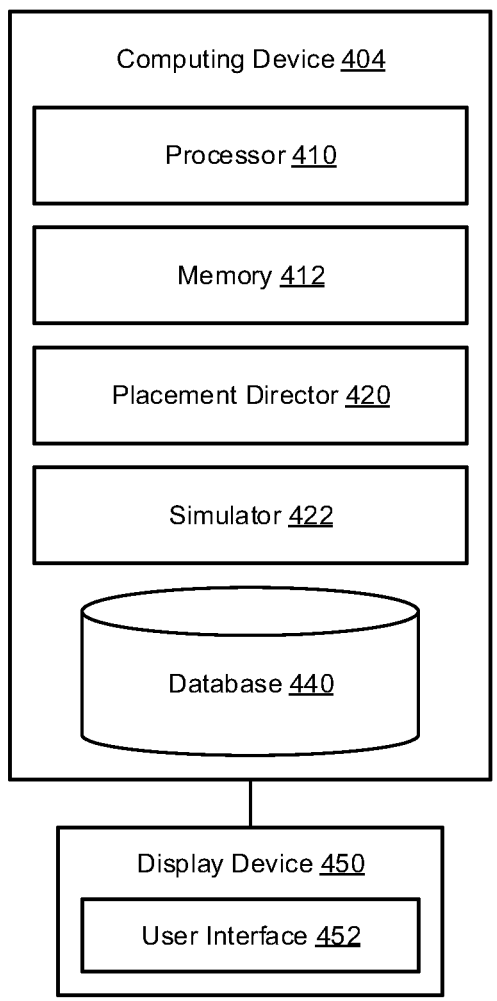
FIG. 4 illustrates a diagram of a system for managing placement of a power grid in physical design in accordance with implementations described herein.

FIG. 4 illustrates a diagram of a system 400 for managing placement of a power grid in physical design in accordance with implementations described herein.

In reference to FIG. 4, the system 400 may be associated with at least one computing device 404 that is implemented as a special purpose machine configured for implementing power grid layout techniques in physical design. In some instances, the computing device 404 includes any standard element(s) and/or component(s), including at least one processor 410, memory 412 (e.g., non-transitory computer-readable storage medium), one or more database(s) 440, power, peripherals, and various other computing elements and/or components that may not be specifically shown in FIG. 4. Also, the computing device 404 may include instructions recorded or stored on the non-transitory computer-readable medium 412 that are executable by the at least one processor 410. The computing device 404 may be associated with a display device 450 (e.g., a monitor or other display) that may be used to provide a user interface (UI) 452, such as, e.g., a graphical user interface (GUI). In some instances, the UI or GUI 452 may be configured to receive various parameters and/or preferences from a user for managing, operating, and/or controlling the computing device 404. Thus, the computing device 404 may include the display device 450 for providing output to a user, and also, the display device 450 may include the UI 452 for receiving input from the user.

In reference to FIG. 4, the computing device 404 may include a placement director 420 that may be configured to cause the at least one processor 410 to analyze and manage a power grid layout in physical cell design along with implementing various schemes and techniques described herein in reference to FIGS. 1-3C, including power grid layout schemes and techniques for implementing integrated circuitry in physical cell design. The placement director 420 may be implemented in hardware and/or software. In some instances, if implemented in software, the placement director 420 may be stored in memory 412 or the database 440. Also, in other instances, if implemented in hardware, the placement director 420 may be a separate processing component that is configured to interface with the processor 410. In addition, the placement director 420 may operate as a placement analyzer and/or placement manager that may be configured to place, land and/or dispose various circuit related components in power grid architecture.

In some instances, the placement director 420 may be configured to cause the at least one processor 410 to perform various operations, as provided herein in reference to power grid layout schemes and techniques described in FIGS. 1-3C. In this instance, the memory 412 has stored thereon instructions that, when executed by the processor 410, cause the processor 410 to perform one or more of the following operations.

For instance, the placement director 420 may be configured to cause the at least one processor 410 to provide a cell layout with at least one power grid line, one or more track lines, and one or more vias. In some instances, the placement director 420 may be configured to cause the at least one processor 410 to determine a cell placement pitch (x-pitch) from architecture rules related to the cell layout, and the placement director 420 may determine a cell height (y-pitch) from the architecture rules related to the cell layout. The cell placement pitch (x-pitch) may refer to a linear horizontal distance across a cell boundary, and the cell height (y-pitch) may refer to a linear vertical distance across the cell boundary. The cell layout may be arranged in a grid pattern with the x-pitch along the linear horizontal distance and the y-pitch along the linear vertical distance. Thus, the cell placement pitch may refer to the x-pitch along a horizontal x-axis, and the cell height may refer to the y-pitch along a vertical y-axis.

In some instances, the placement director 420 may be configured to cause the at least one processor 410 to convert spacing for the vias in terms of the cell placement pitch (x-pitch) to identify free regions on the track lines for placement of the vias. Also, in some instances, the placement director 420 may be configured to cause the at least one processor 410 to determine boundaries for the free regions based on the spacing of the vias from the power grid line and the track lines. The vias may include power grid vias for placement on the power grid line and track vias for placement on the track lines. Also, the power grid vias may be spaced apart by a distance of greater than or equal to one or more cell placement pitches, and the free regions refer to via placement zones for landing the track vias on the track lines within a boundary of the via placement zones.

In some instances, the placement director 420 may be configured to cause the at least one processor 410 to dispose the track vias in the via placement zones defined on the track lines and also to verify that the track vias are disposed within the boundary of the via placement zones based on the spacing of the vias from the power grid line and the track lines. In this instance, the boundary of the via placement zones may be defined by a linear distance from the power grid vias.

In accordance with various implementations described herein in reference to FIGS. 1-3C, any one or more or all of these operations performed by the placement director 420 may be altered, modified, changed and/or updated so as to thereby provide various specific embodiments as shown in FIGS. 1-3C. Also, in some instances, each of the power grid components may be in the form of the physical structure having various shapes with length, width, height and/or other spatial definitions and/or dimensions, and the physical structure may be associated with an integrated circuit (IC) that is included in a place and route (PnR) environment for DRC and various rules associated therewith.

Further, in reference to FIG. 4, the computing device 404 may include a simulator 422 that is configured to cause the at least one processor 410 to generate one or more simulations of the cell layout and related components. The simulator 422 may be referred to as a simulating component or module that may be implemented in hardware or software. If implemented in software, the simulator 422 may be recorded and/or stored in memory 412 or database 440. If implemented in hardware, the simulator 420 may be a separate processing component configured to interface with the processor 410. In some instances, the simulator 422 may refer to a SPICE simulator that is configured to generate SPICE simulations of the cell layout and related components. Generally, SPICE refers to an acronym for Simulation Program with Integrated Circuit Emphasis, which is an open source analog electronic circuit simulator. Also, SPICE may refer to a general-purpose software program used by the semiconductor industry to check the integrity of physical structure designs and to predict the behavior of physical structure designs. Thus, in some instances, the placement director 420 may be configured to interface with the simulator 422 so as to generate various timing data based on one or more simulations (including, e.g., SPICE simulations) of the physical cell layout and related components that are used for analyzing performance characteristics of the integrated circuit including timing data of the cell layout and related components. The placement director 420 may be configured to use the one or more simulations (including, e.g., SPICE simulations) of the cell layout and related components for evaluating operating behavior and conditions thereof.

In some implementations, the computing device 404 may include one or more databases 440 configured to store and/or record various data and information related to implementing power grid layout techniques in physical design. In various instances, the database(s) 440 may be configured to store and/or record data and information related to integrated circuitry, operating conditions, operating behavior and/or timing data of the cell layout and related components. Also, the database(s) 440 may be configured to store data and information related to the cell layout and related components and timing data in reference to simulation data (including, e.g., SPICE simulation data).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method. The method may include providing a cell layout with a power grid line, track lines and vias, and the method may include determining a cell placement pitch from architecture rules related to the cell layout. The method may include converting spacing for the vias in terms of the cell placement pitch to identify free regions on the track lines for placement of the vias, and the method may include determining boundaries for the free regions based on the spacing of the vias from the power grid line and the track lines.

Described herein are various implementations of a device. The device may include a cell layout having a power grid line, track lines and vias, and the device may include free regions defined on the track lines for placement of the vias. In some instances, spacing for the vias may be converted in terms of a cell placement pitch to identify the free regions on the track lines for placement of the vias, and the cell placement pitch may be determined from architecture rules related to the cell layout. Also, the free regions may have boundaries that are determined based on the spacing of the vias from the power grid line and the track lines.

Described herein are various implementations of a system. The system may include a processor and memory having stored thereon instructions that, when executed by the processor, cause the processor to provide a cell layout with a power grid line, track lines and vias. The instructions may cause the processor to determine a cell placement pitch from architecture rules related to the cell layout. The instructions may cause the processor to convert spacing for the vias in terms of the cell placement pitch to identify free regions on the track lines for placement of the vias. The instructions may cause the processor to determine boundaries for the free regions based on the spacing of the vias from the power grid line and the track lines.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
    providing a cell layout with a power grid line, track lines and vias;
    determining a cell placement pitch from architecture rules related to the cell layout;
    converting spacing for the vias in terms of the cell placement pitch to identify free regions on the track lines for placement of the vias;
    determining boundaries for the free regions based on the spacing of the vias from the power grid line and the track lines;
    generating an output based the determined boundaries; and
    determining a cell height from the architecture rules related to the cell layout, wherein the cell placement pitch refers to a linear horizontal distance across a cell boundary, and wherein the cell height refers to a linear vertical distance across the cell boundary.

2. The method of claim 1, wherein the cell layout is arranged in a grid pattern with an x-pitch along a horizontal dimension and a y-pitch along a vertical dimension.

3. The method of claim 2, wherein the cell placement pitch refers to the x-pitch, and wherein a cell height refers to the y-pitch.

4. The method of claim 1, wherein the vias include power grid vias for placement on the power grid line and track vias for placement on the track lines.

5. The method of claim 4, wherein the power grid vias are spaced apart by a distance that is greater than or equal to the cell placement pitch, and wherein the cell width refers to a number of cell placement pitches.

6. The method of claim 4, wherein the free regions refer to via placement zones for landing the track vias on the track lines within a boundary of the via placement zones.

7. The method of claim 6, further comprising:
disposing the track vias in the via placement zones defined on the track lines; and
verifying that the track vias are disposed within the boundary of the via placement zones based on the spacing of the vias from the power grid line and the track lines,
wherein the boundary of the via placement zones are defined by a linear distance from the power grid vias.

8. The method of claim 1, wherein:
the power grid line comprises one or more power grid lines,
the track lines comprise one or more track lines, and
the vias comprise any number of vertical interconnect access lines associated with the one or more power grid lines and the one or more track lines.

9. A device, comprising:
a cell layout having a power grid line, track lines and vias; and
free regions defined on the track lines for placement of the vias,
wherein spacing for the vias is converted as different multiples of a cell placement pitch to identify the free regions on the track lines for placement of the vias,
wherein the cell placement pitch is determined from architecture rules related to the cell layout,
wherein the free regions have boundaries that are determined based on the spacing of the vias from the power grid line and the track lines, and
wherein an output is generated based on the determined boundaries.

10. The device of claim 9, wherein:
a cell height is determined from the architecture rules related to the cell layout,
the cell placement pitch refers to a linear horizontal distance across a cell boundary, and
the cell height refers to a linear vertical distance across the cell boundary.

11. The device of claim 9, wherein:
the cell layout is arranged in a grid pattern with an x-pitch along a horizontal dimension and a y-pitch along a vertical dimension,
the cell placement pitch refers to the x-pitch, and
a cell height refers to the y-pitch.

12. The device of claim 9, wherein:
the vias include power grid vias for placement on the power grid line and track vias for placement on the track lines,
the power grid vias are spaced apart by a distance that is greater than or equal to a cell width, and the cell width refers to a number of cell placement pitches, and
the free regions refer to via placement zones for landing the track vias on the tracks within a boundary of the via placement zones.

13. The device of claim 12, wherein:
the track vias are disposed within the boundary of the via placement zones based on the spacing of the vias from the power grid line and the track lines, and
the boundary of the via placement zones are defined by a linear distance from the power grid vias, and
locations of the via placement zones are defined as complementary to locations of the power grid vias.

14. The device of claim 9, wherein:
the power grid line comprises one or more power grid lines,
the track lines comprise one or more track lines, and
the vias comprise any number of vertical interconnect access lines associated with the one or more power grid lines and the one or more track lines.

15. A computer-implemented system, comprising:
a processor; and
memory having stored thereon instructions that, when executed by the processor, cause the processor to:
provide a cell layout with a power grid line, track lines and vias;
determine a cell placement pitch from architecture rules related to the cell layout;
convert spacing for the vias as different multiples of the cell placement pitch to identify free regions on the track lines for placement of the vias;
determine boundaries for the free regions based on the spacing of the vias from the power grid line and the track lines, and
generate an output based the determined boundaries.

16. The system of claim 15, wherein the instructions further cause the processor to:
determine a cell height from the architecture rules related to the cell layout,
wherein the cell placement pitch refers to a linear horizontal distance across a cell boundary, and the cell height refers to a linear vertical distance across the cell boundary,
wherein the cell layout is arranged in a grid pattern with an x-pitch along the linear horizontal distance and a y-pitch along the linear vertical distance, and
wherein the cell placement pitch refers to the x-pitch, and the cell height refers to the y-pitch.

17. The system of claim 15, wherein:
the vias include power grid vias for placement on the power grid line and track vias for placement on the track lines,
the power grid vias are spaced apart by a distance that is greater than or equal to a cell width, and the cell width refers to a number of cell placement pitches, and
the free regions refer to via placement zones for landing the track vias on the track lines within a boundary of the via placement zones.

18. The system of claim 15, wherein the instructions further cause the processor to:
dispose the track vias in the via placement zones defined on the track lines; and
verify that the track vias are disposed within the boundary of the via placement zones based on the spacing of the vias from the power grid line and the track lines,
wherein the boundary of the via placement zones are defined by a linear distance from the power grid vias.

* * * * *